United States Patent
Lee et al.

(10) Patent No.: US 12,165,278 B2
(45) Date of Patent: Dec. 10, 2024

(54) DOWNSCALER AND METHOD OF DOWNSCALING

(71) Applicant: Imagination Technologies Limited, Kings Langley (GB)

(72) Inventors: Timothy Lee, Hertfordshire (GB); Alan Vines, Hertfordshire (GB); David Hough, Hertfordshire (GB)

(73) Assignee: Imagination Technologies Limited, Kings Langley (GB)

( * ) Notice: Subject to any disclaimer, the term of this patent is extended or adjusted under 35 U.S.C. 154(b) by 368 days.

(21) Appl. No.: 17/479,935

(22) Filed: Sep. 20, 2021

(65) Prior Publication Data

US 2022/0092731 A1 Mar. 24, 2022

(30) Foreign Application Priority Data

Sep. 18, 2020 (GB) ...................................... 2014706
Sep. 18, 2020 (GB) ...................................... 2014707

(51) Int. Cl.
*G06K 9/00* (2022.01)
*G06F 5/01* (2006.01)
(Continued)

(52) U.S. Cl.
CPC .................. *G06T 3/40* (2013.01); *G06F 5/01* (2013.01); *H03H 17/06* (2013.01); *H03H 2017/0081* (2013.01)

(58) Field of Classification Search
CPC .............................................. H03H 2017/0081
See application file for complete search history.

(56) References Cited

U.S. PATENT DOCUMENTS 4,908,874 A 3/1990 Gabriel
5,157,395 A 10/1992 Del Signore et al.
(Continued)

FOREIGN PATENT DOCUMENTS

GB 2442623 A 4/2008
WO 93/12507 A1 6/1993
(Continued)

OTHER PUBLICATIONS

Wikipedia, Apr. 16, 2020, "Pyramid (image processing)", Available from https://web.archive.org/web/20200521052453/https://en.wikipedia.org/wiki/Pyramid (image processing), accessed on Feb. 24, 2021 in particular see "Pyramid generation" and "Pyramid generation kernels".

*Primary Examiner* — Hadi Akhavannik
(74) *Attorney, Agent, or Firm* — Potomac Law Group, PLLC; Vincent M DeLuca

(57) ABSTRACT

A hardware downscaling module and downscaling methods for downscaling a two-dimensional array of values. The hardware downscaling unit comprises a first group of one-dimensional downscalers; and a second group of one-dimensional downscalers; wherein the first group of one-dimensional downscalers is arranged to receive a two-dimensional array of values and to perform downscaling in series in a first dimension; and wherein the second group of one-dimensional downscalers is arranged to receive an output from the first group of one-dimensional downscalers and to perform downscaling in series in a second dimension.

18 Claims, 8 Drawing Sheets

(51) Int. Cl.
 G06T 3/40 (2006.01)
 H03H 17/06 (2006.01)
 H03H 17/00 (2006.01)

(56) References Cited

U.S. PATENT DOCUMENTS

| | | |
|---|---|---|
| 5,872,480 A | 2/1999 | Huang |
| 6,321,246 B1 | 11/2001 | Page et al. |
| 6,411,333 B1 * | 6/2002 | Auld .................. G09G 5/393 |
| | | 348/E7.012 |
| 6,611,625 B1 | 8/2003 | Son et al. |
| 6,661,427 B1 * | 12/2003 | MacInnis .............. G06F 3/0611 |
| | | 348/E5.062 |
| 6,681,059 B1 * | 1/2004 | Thompson ........... H04N 7/0135 |
| | | 348/E7.012 |
| 6,975,779 B1 | 12/2005 | Brett et al. |
| 7,215,708 B2 * | 5/2007 | Gagarin ................ H04N 19/90 |
| | | 375/E7.206 |
| 9,305,362 B1 * | 4/2016 | Szedo ................ H04N 23/6811 |
| 2004/0252759 A1 | 12/2004 | Winder et al. |
| 2005/0069224 A1 * | 3/2005 | Nowicki ............... G06T 3/4084 |
| | | 382/235 |
| 2005/0196072 A1 * | 9/2005 | Zhong .................. G06T 3/4007 |
| | | 348/581 |
| 2006/0126967 A1 * | 6/2006 | Jen ........................ G06T 3/4007 |
| | | 382/298 |
| 2011/0131265 A1 * | 6/2011 | Liu ....................... H04N 5/2628 |
| | | 708/313 |
| 2012/0027252 A1 * | 2/2012 | Liu ........................ G06V 10/50 |
| | | 382/103 |
| 2012/0183224 A1 * | 7/2012 | Kirsch ...................... G06T 7/00 |
| | | 382/224 |
| 2016/0127650 A1 * | 5/2016 | Van Den Herik ....... G09G 3/20 |
| | | 348/333.01 |
| 2016/0284314 A1 * | 9/2016 | Darshan ................... G06T 3/40 |
| 2017/0200257 A1 * | 7/2017 | Van Den Herik ........ G06T 3/20 |

FOREIGN PATENT DOCUMENTS

| | | |
|---|---|---|
| WO | 2007/047478 A2 | 4/2007 |
| WO | 2020/168508 A1 | 8/2020 |

\* cited by examiner

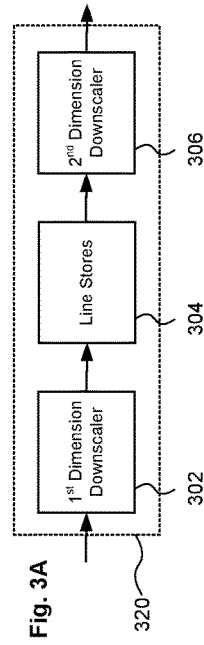
Fig. 3A
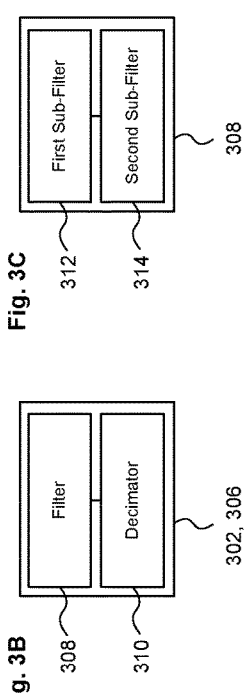
Fig. 3B
Fig. 3C
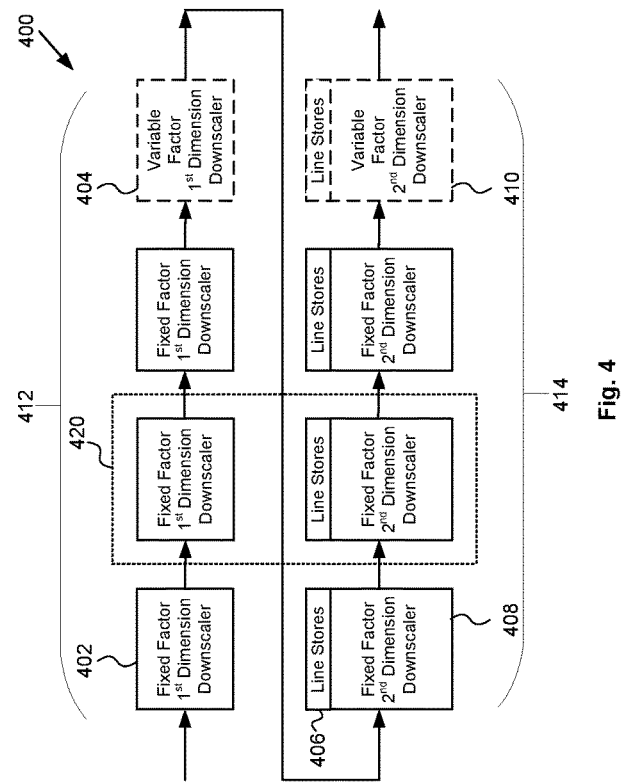
Fig. 4

| 0.9 | 2.1 | 3.4 | 4.8 | 5.7 |
|---|---|---|---|---|
| 2.1 | 3.5 | 5.0 | 7.0 | 8.3 |
| 3.4 | 5.0 | 5.5 | 7.0 | 8.3 |
| 4.8 | 7.0 | 7.0 | 7.5 | 8.4 |
| 5.7 | 8.3 | 8.3 | 8.4 | 8.2 |

Fig. 7B

| 1.1 | 3.0 | 5.0 | 7.0 | 8.3 |
| 1.4 | 3.1 | 5.0 | 7.0 | 8.3 |
| 2.1 | 3.4 | 5.0 | 7.0 | 8.3 |
| 2.8 | 4.1 | 5.1 | 7.0 | 8.3 |
| 3.4 | 5.0 | 5.4 | 7.0 | 8.3 |
| 4.1 | 6.0 | 6.1 | 7.1 | 8.3 |
| 4.8 | 7.0 | 7.0 | 7.4 | 8.3 |
| 5.5 | 8.0 | 8.0 | 8.1 | 8.4 |
| 6.2 | 9.0 | 9.0 | 9.0 | 8.7 |
| 6.9 | 10.0 | 10.0 | 10.0 | 9.4 |

Fig. 7A

| 1 | 2 | 3 | 4 | 5 | 6 | 7 | 8 | 9 | 10 |
|---|---|---|---|---|---|---|---|---|---|
| 2 | 2 | 3 | 4 | 5 | 6 | 7 | 8 | 9 | 10 |
| 3 | 3 | 3 | 4 | 5 | 6 | 7 | 8 | 9 | 10 |
| 4 | 4 | 4 | 4 | 5 | 6 | 7 | 8 | 9 | 10 |
| 5 | 5 | 5 | 5 | 6 | 7 | 8 | 9 | 9 | 10 |
| 6 | 6 | 6 | 6 | 6 | 7 | 8 | 9 | 9 | 10 |
| 7 | 7 | 7 | 7 | 7 | 7 | 8 | 8 | 9 | 10 |
| 8 | 8 | 8 | 8 | 8 | 8 | 8 | 8 | 9 | 10 |
| 9 | 9 | 9 | 9 | 9 | 9 | 9 | 9 | 9 | 10 |
| 10 | 10 | 10 | 10 | 10 | 10 | 10 | 10 | 10 | 10 |

Fig. 8A

| 1 | 2 | 3 | 4 | 5 | 6 | 7 | 8 | 9 | 10 |
|---|---|---|---|---|---|---|---|---|---|
| 2 | 2 | 3 | 4 | 5 | 6 | 7 | 8 | 9 | 10 |
| 3 | 3 | 3 | 4 | 5 | 6 | 7 | 8 | 9 | 10 |
| 4 | 4 | 4 | 4 | 5 | 6 | 7 | 8 | 9 | 10 |
| 5 | 5 | 5 | 5 | 5 | 6 | 7 | 8 | 9 | 10 |
| 6 | 6 | 6 | 6 | 6 | 6 | 7 | 8 | 9 | 10 |
| 7 | 7 | 7 | 7 | 7 | 7 | 7 | 8 | 9 | 10 |
| 8 | 8 | 8 | 8 | 8 | 8 | 8 | 8 | 9 | 10 |
| 9 | 9 | 9 | 9 | 9 | 9 | 9 | 9 | 9 | 10 |
| 10 | 10 | 10 | 10 | 10 | 10 | 10 | 10 | 10 | 10 |

Fig. 8B

| 0.3 | 1.0 | 2.0 | 3.0 | 4.0 | 5.0 | 6.0 | 7.0 | 8.0 | 9.0 | 7.3 |
|---|---|---|---|---|---|---|---|---|---|---|
| 0.5 | 1.5 | 2.3 | 3.0 | 4.0 | 5.0 | 6.0 | 7.0 | 8.0 | 9.0 | 7.3 |
| 0.8 | 2.3 | 3.0 | 3.3 | 4.0 | 5.0 | 6.0 | 7.0 | 8.0 | 9.0 | 7.3 |
| 1.0 | 3.0 | 4.0 | 4.0 | 4.3 | 5.0 | 6.0 | 7.0 | 8.0 | 9.0 | 7.3 |
| 1.3 | 3.8 | 5.0 | 5.0 | 5.0 | 5.3 | 6.0 | 7.0 | 8.0 | 9.0 | 7.3 |
| 1.5 | 4.5 | 6.0 | 6.0 | 6.0 | 6.0 | 6.3 | 7.0 | 8.0 | 9.0 | 7.3 |
| 1.8 | 5.3 | 7.0 | 7.0 | 7.0 | 7.0 | 7.0 | 7.3 | 8.0 | 9.0 | 7.3 |
| 2.0 | 6.0 | 8.0 | 8.0 | 8.0 | 8.0 | 8.0 | 8.0 | 8.3 | 9.3 | 7.3 |
| 2.3 | 6.8 | 9.0 | 9.0 | 9.0 | 9.0 | 9.0 | 9.0 | 9.0 | 9.3 | 7.3 |
| 2.5 | 7.5 | 10.0 | 10.0 | 10.0 | 10.0 | 10.0 | 10.0 | 10.0 | 10.0 | 10.0 |

Fig. 8C

| 1.1 | 3.0 | 5.0 | 7.0 | 8.3 |
|---|---|---|---|---|
| 1.4 | 3.1 | 5.0 | 7.0 | 8.3 |
| 2.1 | 3.4 | 5.0 | 7.0 | 8.3 |
| 2.8 | 4.1 | 5.1 | 7.0 | 8.3 |
| 3.4 | 5.0 | 5.4 | 7.0 | 8.3 |
| 4.1 | 6.0 | 6.1 | 7.1 | 8.3 |
| 4.8 | 7.0 | 7.0 | 7.4 | 8.3 |
| 5.5 | 8.0 | 8.0 | 8.1 | 8.4 |
| 6.2 | 9.0 | 9.0 | 9.0 | 8.7 |
| 6.9 | 10.0 | 10.0 | 10.0 | 9.4 |

Fig. 8D

| 0.3 | 0.6 | 1.3 | 1.8 | 2.1 |
|---|---|---|---|---|
| 0.9 | 2.3 | 3.8 | 5.3 | 6.2 |
| 1.5 | 3.1 | 5.0 | 7.0 | 8.3 |
| 2.1 | 3.9 | 5.0 | 7.0 | 8.3 |
| 2.8 | 4.1 | 5.1 | 7.0 | 8.3 |
| 3.4 | 5.0 | 5.5 | 7.1 | 8.3 |
| 4.1 | 6.0 | 6.1 | 7.5 | 8.3 |
| 4.8 | 7.0 | 7.0 | 8.1 | 8.4 |
| 5.5 | 8.0 | 7.5 | 9.0 | 6.8 |
| 6.2 | 9.0 | 8.0 | 7.3 | 6.9 |
| 5.0 | 7.3 | 7.3 | | |

Fig. 8E

| 0.9 | 2.1 | 3.4 | 4.8 | 5.7 |
|---|---|---|---|---|
| 2.1 | 3.5 | 5.0 | 7.0 | 8.3 |
| 3.4 | 5.0 | 5.5 | 7.0 | 8.3 |
| 4.6 | 7.0 | 7.0 | 7.5 | 8.4 |
| 5.7 | 8.3 | 8.3 | 8.4 | 8.2 |

DOWNSCALER AND METHOD OF DOWNSCALING

BACKGROUND

Image scaling can be useful in a variety of circumstances. In some circumstances, it can be desirable to scale many images—for example, some operations may receive a feed of images, either in a sequence or as a batch, that all need to be rescaled.

As a specific example, convolutional neural networks (CNN's) can be used to analyse image data, for example to identify objects. The image data may be data representing one or more static images (e.g. individual photographs, perhaps to be analysed for image classification purposes), or may be video data (e.g. a stream of images, perhaps to be analysed for tracking motion through the series of images). In any case, such analysis can be computationally intensive. As a result, it can be desirable to provide relatively small images to a CNN, to reduce the amount of computation involved. However, as technology develops, source image and video data are increasingly of high resolution. This means that it may be desirable to reduce the size of the source data before it is input to a CNN. By way of example, a high-resolution video recorded in a 4K format maybe reduced by a factor of around 20 in both the horizontal and vertical directions.

CNNs may be implemented using specific hardware, such as a neural network accelerator (NNA), designed to process CNNs efficiently. In such cases, it can be desirable to also perform any necessary image scaling in associated hardware too. Hardware scaling units for performing such image scaling are known.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A hardware downscaling module and downscaling methods are described, for downscaling a two-dimensional array of values The hardware downscaling unit comprises a first group of one-dimensional downscalers; and a second group of one-dimensional downscalers; wherein the first group of one-dimensional downscalers is arranged to receive a two-dimensional array of values and to perform downscaling in series in a first dimension; and wherein the second group of one-dimensional downscalers is arranged to receive an output from the first group of one-dimensional downscalers and to perform downscaling in series in a second dimension.

According to a first aspect, there is provided a hardware downscaling module for downscaling an array of values having at least two dimensions, the hardware downscaling unit comprising: a first group of one-dimensional downscalers; and a second group of one-dimensional downscalers; wherein the first group of one-dimensional downscalers is arranged to receive the array of values and to perform downscaling in series in a first dimension; and wherein the second group of one-dimensional downscalers is arranged to receive an output from the first group of one-dimensional downscalers and to perform downscaling in series in a second dimension.

Optionally, the first and second groups each comprise a plurality of fixed factor downscalers. In some arrangements, each fixed factor downscaler can downscale by the same fixed factor, and in some examples each fixed factor downscaler is a 2:1 downscaler, and optionally each 2:1 downscaler comprises two 3-tap FIR filters.

Optionally, the hardware downscaling module further comprises hardware logic configured to bypass one or more of the one-dimensional downscalers in the first and second groups in response to a control signal.

Optionally, the first and second groups each further comprise a single variable factor downscaler.

Optionally, the hardware downscaling module is configured to receive the array of values line-by-line, and wherein the first dimension is a dimension along the lines, and the second dimension is orthogonal to the first dimension. Each of second group of downscalers can further comprise one or more line stores. The line widths of the line stores can be the same for all of the second group of downscalers, and optionally the line widths can be a line width of the output from the first group of one-dimensional downscalers.

According to a second aspect, there is provided a computer-implemented method for downscaling an array of values having at least two dimensions using a hardware downscaling module, the method comprising: providing the array of values as an input to a first group of one-dimensional downscalers; performing, at the first group of one-dimensional downscalers, a series of downscaling operations in a first dimension; providing an output from the first group of one-dimensional downscalers to a second group of one-dimensional downscalers; and performing, at the second group of one-dimensional downscalers, a series of downscaling operations in a second dimension.

Optionally, the first and second groups each comprise a plurality of fixed factor downscalers.

Optionally, the method further comprises bypassing, in response to a control signal, one or more of the one-dimensional downscalers in the first and second groups.

Optionally, the first and second groups each further comprise a single variable factor downscaler.

Optionally, the method further comprises receiving the array of values line-by-line, and wherein the first dimension is a dimension along the lines, and the second dimension is orthogonal to the first dimension.

Optionally, performing, at the second group of one-dimensional downscalers, a series of downscaling operations in the second dimension, further comprises accessing a line store of the same width for each downscaling operation.

According to a third aspect, there is provided a hardware downscaling module configured to perform the method of any of the variations of the second aspect.

Optionally, the hardware downscaling module is embodied on an integrated circuit.

According to a fourth aspect, there is provided a method of manufacturing, using an integrated circuit manufacturing system, a hardware downscaling module according to any of the variations of the third aspect.

Optionally, the method further comprises: processing, using a layout processing system, a computer readable description of the hardware downscaling module so as to generate a circuit layout description of an integrated circuit embodying the hardware downscaling module; and manufacturing, using an integrated circuit generation system, hardware downscaling module according to the circuit layout description.

According to a fifth aspect, there is provided computer readable code configured to cause the method of any variation of the second or fourth aspect to be performed when the code is run.

According to a sixth aspect, there is provided a computer readable storage medium having encoded thereon the computer readable code of the fifth aspect.

According to a seventh aspect, there is provided an integrated circuit definition dataset that, when processed in an integrated circuit manufacturing system, configures the integrated circuit manufacturing system to manufacture a hardware downscaling module according to any variation of the first or third aspect.

According to an eighth aspect, there is provided a computer readable storage medium having stored thereon a computer readable description of a hardware downscaling module according to any variation of the first or third aspect, that, when processed in an integrated circuit manufacturing system, causes the integrated circuit manufacturing system to manufacture an integrated circuit embodying the hardware downscaling module.

According to a ninth aspect, there is provided an integrated circuit manufacturing system configured to manufacture a hardware downscaling module according to any variation of the first or third aspect.

According to a tenth aspect, there is provided an integrated circuit manufacturing system comprising: a non-transitory computer readable storage medium having stored thereon a computer readable description of a hardware downscaling module according to any variation of the first or third aspect; a layout processing system configured to process the computer readable description so as to generate a circuit layout description of an integrated circuit embodying a hardware downscaling module; and an integrated circuit generation system configured to manufacture a hardware downscaling module according to the circuit layout description.

A hardware downscaler and an architecture for implementing a FIR filter are described. The downscaler can be arranged for downscaling by a half in one dimension. The downscaler can comprise: hardware logic implementing a first three-tap FIR filter; and hardware logic implementing a second three-tap FIR filter; wherein the output from the hardware logic implementing the first three-tap filter is provided as an input to the hardware logic implementing the second three-tap filter.

There is provided a hardware downscaler, for downscaling by a half in one dimension, the downscaler comprising: hardware logic implementing a first three-tap FIR filter; and hardware logic implementing a second three-tap FIR filter; wherein the output from the hardware logic implementing the first three-tap filter is provided as an input to the hardware logic implementing the second three-tap filter.

There is also provided a hardware architecture for implementing a FIR filter with $2^N+1$ binomial coefficients, where N is an integer and N>1, the architecture comprising: a series of N three-tap FIR sub-filters; wherein, for every n, where n is an integer from 1 to N−1, the architecture is configured to provide the output from the nth one of the sub-filters as an input to the (n+1)th sub-filter.

There is also provided a computer-implemented method for downscaling data by a half in at least one dimension, the method comprising: providing data as an input to hardware logic implementing a first three-tap FIR filter; performing, at the hardware logic implementing the first three-tap FIR filter, a first filtering operation; providing an output from the hardware logic implementing the first three-tap FIR filter to hardware logic implementing a second three-tap FIR filter; performing, at the hardware logic implementing the second three-tap FIR filter, a second filtering operation.

There is also provided a computer-implemented method for filtering data with a FIR filter with $2^N+1$ binomial coefficients, where N is an integer and N>1, the method comprising: filtering the data through hardware logic implementing a series of N three-tap FIR sub-filters; and wherein, for every n, where n is an integer from 1 to N−1, the filtering comprises providing the output from the nth one of the sub-filters as an input to the (n+1)th sub-filter.

The downscaling module, downscaler or filter may be embodied in hardware on an integrated circuit. There may be provided a method of manufacturing, at an integrated circuit manufacturing system, a downscaling module, downscaler or filter. There may be provided an integrated circuit definition dataset that, when processed in an integrated circuit manufacturing system, configures the system to manufacture a downscaling module, downscaler or filter. There may be provided a non-transitory computer readable storage medium having stored thereon a computer readable description of a downscaling module, downscaler or filter that, when processed in an integrated circuit manufacturing system, causes the integrated circuit manufacturing system to manufacture an integrated circuit embodying a downscaling module, downscaler or filter.

There may be provided an integrated circuit manufacturing system comprising: a non-transitory computer readable storage medium having stored thereon a computer readable description of the downscaling module, downscaler or filter; a layout processing system configured to process the computer readable description so as to generate a circuit layout description of an integrated circuit embodying the downscaling module, downscaler or filter; and an integrated circuit generation system configured to manufacture the downscaling module, downscaler or filter according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which:

FIG. 3A shows a block diagram of component parts of a two-dimensional downscaler; FIG. 3B shows a block diagram of component parts of a one-dimensional downscaler; FIG. 3C shows a block diagram of component parts of a filter.

FIG. 4 shows a block diagram of an alternative implementation of a chain of two-dimensional downscalers.

FIG. 5A, FIG. 5B, FIG. 5C, FIG. 5D and FIG. 5E show example data arrays for explaining the operation of a first two two-dimensional downscaler followed by a second two-dimensional downscaler.

FIG. 6A, FIG. 6B, FIG. 6C, FIG. 6D and FIG. 6E show example data arrays for explaining the operation of two downscalers operating in one dimension followed by two downscalers operating in a second dimension.

FIG. 7A, FIG. 7B and FIG. 7C show example data arrays for explaining the operation of a downscaler employing a two-dimensional 5-tap filter and decimation by a factor of 2.

FIG. 8A, FIG. 8B, FIG. 8C, FIG. 8D and FIG. 8E show example data arrays for explaining the operation of a downscaler employing two two-dimensional 3-tap filters and decimation by a factor of 2.

Figure 1:
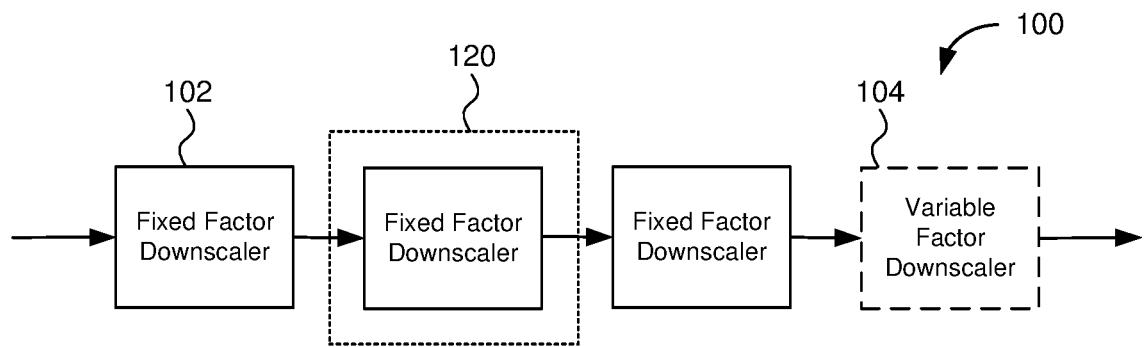
FIG. 1 shows a block diagram of a chain of downscalers.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art. Embodiments will now be described by way of example only.

As discussed above, hardware image scaling units are known. However, the present inventors have identified that known hardware scalers are not particularly efficient.

As already mentioned, image data can be data representing static images, or frames from a video. A basic approach to downsampling or downscaling is to employ decimation. In signal processing, the term decimation is used to refer to the removal of data points or samples. For example, decimation by a factor of 10 indicates that every tenth sample is retained, whilst decimation by a factor of 2 indicates that every second sample is retained. In terms of two-dimensional image data, decimation may be applied in both dimensions to reduce image size.

Image data can be considered to be made up of 'lines' of sample values (which may correspond to pixel values, although an image may have a higher sample density than the pixel density of a display on which it is shown, or vice versa). For ease of discussion, this document refers to an x dimension, extending in a horizontal direction of an image, and a y dimension, extending in a vertical direction of an image, with the image data provided as 'lines' of samples in the x dimension. That is, the image data may be stored in memory, and read therefrom, as a series of values for a first line extending in the x direction, followed by a series of values representing the next line down in the y dimension, and so on. However, it will be understood that these are merely labels to assist with understanding, and that images may have different orientations. Indeed, instead of a 'line' corresponding to a 'row' of values (as in the example above) the 'line' may refer to a column of values—that is the data may be stored and read as one column of values followed by the next and so on. Alternatively, image data may be stored in memory in a format such as Morton (or 'Z') order, a tiled, or even a compressed format, which, while the data is not stored as rows or columns corresponding to the overall image, still permits two dimensional image data to be read as a series of lines in either 'row' or 'column' directions. It will be understood that what is relevant for the present document is that in such formats the data is stored such that it may be addressed as an array of values and that one dimension of the array will correspond to the 'line' direction and the orthogonal direction will correspond to the order the lines are read.

It is further noted that image data may be in a format that has more than two dimensions. For example, an array of image data may be presented as a three-dimensional array of data, wherein each index in one particular dimension might represent a separate image (this may be a way of presenting video data, for example). Alternatively, an image may have multiple channels (e.g. data formats such as RGB, RGBA, YUV etc.) and the overall data may be presented as a three dimensional array in which each channel corresponds to a particular index in one of the dimensions. As such, it will be understood that although the following discussion focuses on downsampling in one or two dimensions, the overall data may have more dimensions than that.

In any case, as a method of downsampling, decimation by itself has the result that the information in the samples that are discarded is entirely lost. It can therefore be desirable to preserve some of that information in the samples that are retained, and one way to do that is to perform some form of averaging between samples before implementing decimation. In terms of sampling theory, a low pass filter is applied before decimation to ensure that the image does not contain frequencies that are not supported by the reduced sample rate of the downsampled image. One way of performing that function is to apply a finite impulse response filter (FIR) to the source data. FIR filters are well known and, in the context of a discrete series of data values, can be described as performing a discrete convolution. That is, the calculation can be summarised as providing a weighted sum of a series of sample values, by multiplying the values by a set of coefficients. The number of coefficients (and, thus, the number of multiplications between a coefficient and a data value) is also referred to as the number of 'taps' for the filter. In image processing, such FIR filters are typically normalised—that is the sum of the coefficients equals 1. However, the coefficients are also commonly referred to as values larger than one, with the understanding that a normalising factor (e.g. a division) is to be applied to the overall calculation.

An FIR filter may be applied to a 2D image by convolution with a 2D filter kernel. A 2D filter kernel applied to an image has a computational complexity of $O(N^2)$, e.g. where the kernel has N×N taps or coefficients. It is known in image processing to implement such a filter as an N-tap 1D filter applied in a first direction followed by an N-tap 1D filter applied in an orthogonal direction, reducing the computational complexity to $O(N)$. The filter is said to be "separable" when this optimisation yields identical results to the 2D filter. The following description describes the filtering of images using two 1D filters applied so as to achieve the effect of a 2D filter.

Typically, to downscale acceptably accurately by a factor of F, a FIR filter implementing a cubic interpolation with 2F+1 taps or coefficients may be used. However, as already mentioned, images may need to be reduced by factors as large as 20 (or even more), which would require a very large FIR. In particular, considering that image data is usually received at the filter as line-by-line sample values (e.g. as discussed above, a series of values progressing in the x direction across a first line in the y direction, followed by a corresponding series of values for the next line in the y direction), implementing a filter in the dimension orthogonal to those lines (so, in the example, the y dimension) requires storing lines of data to access the values required from each line to implement the FIR—e.g. a filter with 2F+1 taps would require 2F line stores (that is, memory configured to store 2F lines of data). So, a large number of taps translates into a large memory area requirement for line stores, with a corresponding large power draw, both of which may be undesirable.

To address this issue, a downscaling module comprising a cascaded series of fixed factor downscalers is proposed. In particular embodiments the fixed factor downscalers are all 2:1 downscalers. A particularly efficient manner of implementing a 2:1 downscaler is also proposed.

FIG. 1 illustrates an example architecture for a hardware downscaling module 100. In this disclosure, the term 'architecture' is used to refer to hardware for performing a particular purpose (e.g. 'a hardware architecture for implementing a FIR filter' is hardware that outputs a FIR filter result, even if the arrangement of hardware for doing so is not conventional). The hardware downscaling module 100 can receive an array of values having at least two dimensions. For example, the array of values might represent image data.

In the illustrated example, three fixed factor downscalers 102 are shown in the downscaling module 100. However, it will be appreciated that this architecture could be modified to include as many fixed factor downscalers as desired (for example, 2, 4 or 5 fixed factor downscalers, or even more) and that the general concept is not limited to the use of three fixed factor downscalers.

The arrangement of FIG. 1 is a pipeline for downscaling or downsampling image data by applying a sequence of fixed factor downscalers 102. That is, the input to the first fixed factor downscaler 102 in the pipeline is the source or input image data. The first fixed factor downscaler 102 operates on the input image data and produces downscaled (by the fixed factor) output image data. The output image data from the first fixed factor downscaler 102 is provided as input data to the next downscaler in the series, which operates on that data and produces an output for the next downscaler in the pipeline, and so on. Each downscaler in the sequence can operate in two dimensions (e.g. on both x and y dimensions) of the image data. This reduces both dimensions of the data passing through the pipeline at each step through the sequence of fixed function downscalers 102.

The fixed factor downscalers 102 may each apply the same downsampling factor as one another. As a result, by applying the fixed factor downscalers in series, the overall downsampling factor increases exponentially. That is, if each fixed factor downscaler applies a downsampling factor of f, then a series of n such downscalers will produce an overall downsampling factor F of f$^n$. Thus, even if the fixed downsampling factor f is small, it is possible to achieve a large overall downsampling factor F with a relatively small chain of fixed factor downscalers in series. For example, a chain of three 2:1 downscalers would achieve an overall downsampling factor of 8, a chain of four such downscalers would achieve a an overall downsampling factor of 16, and a chain of five such downscalers would achieve a an overall downsampling factor of 32.

Depending upon the implementation, a chain of fixed factor downsamplers may be all that is required of a hardware downscaling module. That is, if the source data is of known, unvarying, dimensions, then it may be possible to specify a sequence of fixed factor downsamplers that will always produce the ultimate desired output dimensions—e.g. in the context discussed above, to always have the image size (i.e. the dimensions) required as an input to a particular CNN. However, in other situations it may not be possible to be sure what the incoming data dimensions will be or, if using a sequence of fixed factor downscalers each with the same downsampling factor f, the overall required downsampling factor F may not be an exact power of f. In still other situations it may be desirable to have a hardware downscaling module that is capable of taking source data and downscaling it by different overall factors, or to simply be able to apply different scaling factors to different source data.

FIG. 1 illustrates one way in which such variability may be accommodated. At the end of the pipeline 100 there is a variable factor downscaler 104 (illustrated with a dashed box, to indicate that it need not be present in all implementations). That is, the output from the chain of fixed function downsamplers 102 can be provided to the variable factor downscaler 104. At first sight, this arrangement might seem inefficient because, instead of just having a single variable factor downscaler, there is not only a variable factor downscaler 104 but also a series of fixed factor downscalers 102 as well. However, the series of fixed factor downscalers 102 preceding the variable factor downscaler 104 allows the variable factor downscaler to be implemented much more efficiently.

For example, to achieve an overall downscaling factor of 20, it will be understood from the examples above that a chain of four 2:1 downscalers would not achieve a high enough downscaling factor (the overall downsampling factor would be 16), but a chain of five such downscalers would achieve a an overall downsampling factor that is too high (the overall downsampling factor would be 32). However, a series of four 2:1 downscalers followed by a variable downscaler could achieve the required overall downscaling factor, with the variable downscaler implementing a scaling factor of 1.25. Indeed, the variable downscaler need not be able to implement a scaling factor of greater than 2 (because, instead, additional 2:1 downscalers could be provided as necessary). Such a variable downscaler can be much smaller and simpler to implement than e.g. a variable downsampler capable of performing a 20:1 downsampling in one go.

In fact, it will be understood from the previous example that any overall downsampling factor can be achieved by a sufficiently long series of 2:1 downscalers and a variable downscaler capable of downscaling by a factor of between 2 and 1. More generally, any overall downsampling factor can be achieved by a series of fixed factor downscalers, each applying a downsampling factor of f, and a variable downscaler capable of downscaling by a factor of between f and 1. It will also be understood that the variable downscaler need not be positioned last in the series of downscalers, as shown in FIG. 1. It could be provided at any point in the series of downscalers.

Figure 2:
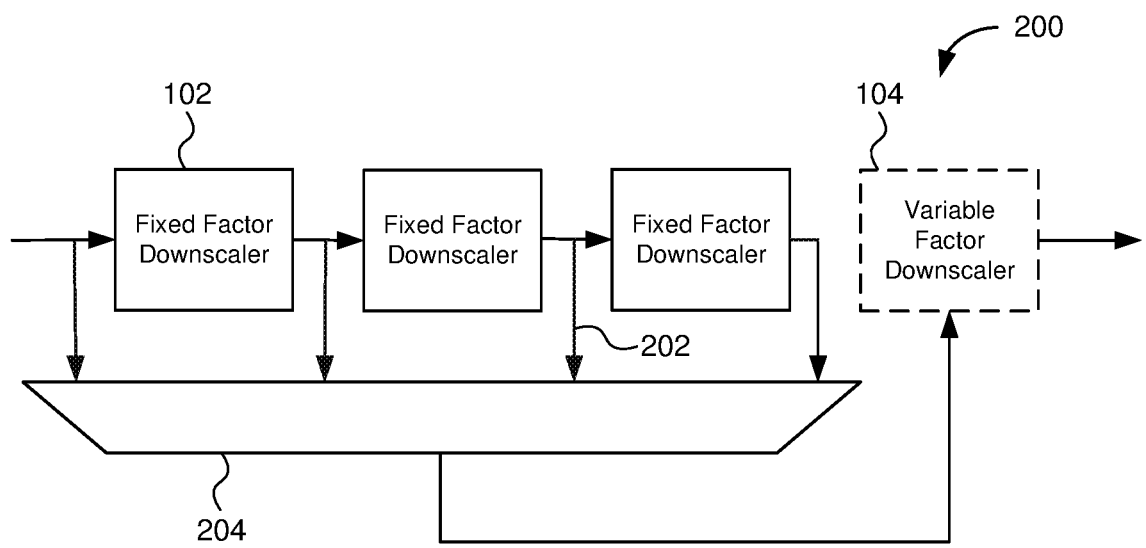
FIG. 2 shows a block diagram of the chain of downscalers of FIG. 1 adapted to incorporate bypasses.

FIG. 2 shows how further flexibility may be built into a hardware pipeline. The pipeline 200 is identical to pipeline 100 but includes bypasses 202. The bypasses 202 allow one or more of the fixed factor downscalers 102 to be bypassed based on a controlling signal. In practice, this can be implemented by a multiplexer 204 arranged to receive the original input data as well as the output from each fixed factor downscaler 102, and to select one of those to output to the variable factor downscaler 104. In any case, this arrangement allows the pipeline to apply a greater range of downscaling factors. For example, if each fixed factor downscaler in FIG. 1 is a 2:1 downscaler and the variable factor downscaler can apply a downsampling factor of between 2 and 1, the range of overall downsampling factors that can be achieved by the pipeline is between 8 and 16. In contrast, adding the bypasses 202 to have the same downscalers in the arrangement of FIG. 2 achieves a pipeline with a range of overall downsampling factors from 1 to 16.

In the foregoing consideration of FIGS. 1 and 2, each downscaler 102, 104 has been considered as one entity—i.e. one unit applying a two-dimensional downsampling. However, each of those downscalers can be considered to comprise three parts: (i) a one-dimensional downscaler in a first dimension (e.g. the x direction), (ii) line stores and (iii) a one-dimensional downscaler in a second dimension (e.g. they direction). This is shown in FIG. 3A, which illustrates these sub-components (1$^{st}$ dimension downscaler 302; line stores 304; 2$^{nd}$ dimension downscaler 306) for a generic downscaler. To aid understanding, dotted box 120 in FIG. 1 encompasses one 2D downscaler, which is equivalent to the three parts encompassed by the dotted box 320 in FIG. 3. It will be understood that this arrangement is applicable to both fixed factor and variable factor downscalers.

Moreover, as already discussed, each one-dimensional downscaler 302,306 may comprise both a filter 308 and a decimator 310 as shown in FIG. 3B. A filter 308 itself may comprise one or more sub-filter components 312,314 as shown in FIG. 3C and discussed in more detail below.

In practice, as mentioned above, image data will be saved and read out line by line—that is, a sequence of values representing one line of image data in a first dimension (typically in the horizontal direction, but not necessarily), followed by a sequence of values representing the next line of data, one step along in the second dimension, and so on until the end of the image.

In these cases it is relatively simple to implement the downscaler in the first (e.g. x) dimension 302, because the values in that dimension are received one after the other, in sequence, and thus can be operated upon as they are received.

However, it is more complex to implement the downscaler 306 in the second or orthogonal dimension (e.g. y dimension). For example, to implement a filter and then decimate the values in the second dimension, lines of data in the first dimension (up to a number of lines corresponding to the width of the filter) must be read out, and then the relevant values from each line selected and then operated upon. This is why, in FIG. 3, the line stores 304 are required following the downscaler in the first dimension 302: the output of the downscaler in the first dimension must be buffered so as to allow the downscaler in the second dimension 306 to have access to the values it needs to operate upon. Referring back to the earlier discussion, to downscale in the second dimension accurately by a factor of f using a FIR filter, typically a FIR filter with 2f+1 taps or coefficients will be required which in turn would require 2f line stores.

It will therefore be understood that if two-dimensional downscaling is implemented in each fixed factor downscaler 102 shown in FIG. 1, then even if each fixed factor downscaler 102 implements the same scaling factor, the required size of the line stores for each fixed factor downscaler will be different. That is, line stores in each fixed factor downscaler 102 will be configured to store the same number of lines (dictated by the scaling factor), but the length of the lines required to be stored will be different. That is because the line store length is typically determined by the input line width, and that is different for each fixed factor downscaler, depending on the number of downscalers that have come before it. As such, an efficient implementation would provide a differently sized line store for each fixed factor downscaler. Nonetheless, even if the line stores are set to be smaller for downscalers occurring later in the series, the line stores can still represent a large memory requirement.

FIG. 4 illustrates an alternative example architecture for a hardware downscaling module 400. This arrangement is equivalent to that of FIG. 1, in terms of the overall number of downscaling operations, but (i) the downscaling operations in the first and second dimensions have been shown separately and (ii) the downscaling operations in the first dimension have been grouped before the downscaling operations in the second dimension (in other words, there is a first group of downscalers 412, each operating the same dimension, followed by a second group of downscalers 414, operating in the same dimension as each other and different to the dimension the first group operate in). That is, the FIG. 4 architecture receives an array of values as an input, and implements a sequence or series of one-dimensional downscaling operations in a first dimension before passing the output of that sequence of operations to be an input to a second sequence of one-dimensional downscaling operations that operate in the second dimension. To aid understanding, dotted box 420 in FIG. 4 encompasses a fixed factor downscaler from the first group of 1D downscalers 412 and a fixed factor downscaler (with associated line stores), from the second group of 1D downscalers 414, and the contents of that box are equivalent to the three parts encompassed by the dotted box 320 in FIG. 3, and the 2D downscaler encompassed by box 120 in FIG. 1.

Before considering FIG. 4 in more detail, it is noted that the same variations discussed with respect to FIGS. 1 and 2, to allow variability of overall downsampling factor, also apply to the FIG. 4 architecture. That is, although FIG. 4 illustrates 3 fixed factor downscalers for each of the first and second dimensions 402, 408, it will be understood that any number of fixed factor downscalers may be used, as required. Those fixed value downscalers may all apply the same downscaling factor, or may apply a mixture of different downscaling factors, depending upon requirements. Also, FIG. 4 shows that each group of downscalers may include a variable factor downscaler 404, 410, but it will be understood that these may not be required in some implementations (e.g. if the overall downsampling factor is fixed and is implemented by a sequence of fixed factor downscalers). Finally, as discussed with respect of FIG. 2, further flexibility may be provided by implementing a series of bypasses (not shown in FIG. 4, for the sake of simplicity) to allow one or more of the fixed factor downscalers to be bypassed, thus extending the range of the overall downsampling factors that can be implemented. The skilled reader will understand how those options apply to the FIG. 4 architecture based on the discussion of FIGS. 1 and 2, and so they are not discussed in detail again for the sake of brevity.

In FIG. 4, an equal number of 1$^{st}$ dimension and 2$^{nd}$ dimension fixed factor downscalers are provided, as in FIG. 1 (although individual 1$^{st}$ and 2$^{nd}$ dimension downscalers are not explicitly shown in FIG. 1). However, the pipeline has been rearranged so that all the downscaling operations in the first dimension are performed, in series, before any downscaling operations in the second dimension. The operations in the second dimension are then also performed in series. FIGS. 5 and 6 illustrate how this does not change overall output in an ideal case, although the intermediate stages of downscaling may have different individual outputs. Of course, in practice, slight changes in the results may occur due to the use of floating point arithmetic which can lead to small differences depending on the order of operations (and even in integer arithmetic, intermediate rounding considerations can also lead to slight differences in results).

Figures 5A, 5B, 5C, 5D, 5E, 6A, 6B, 6C, 6D, 6E:
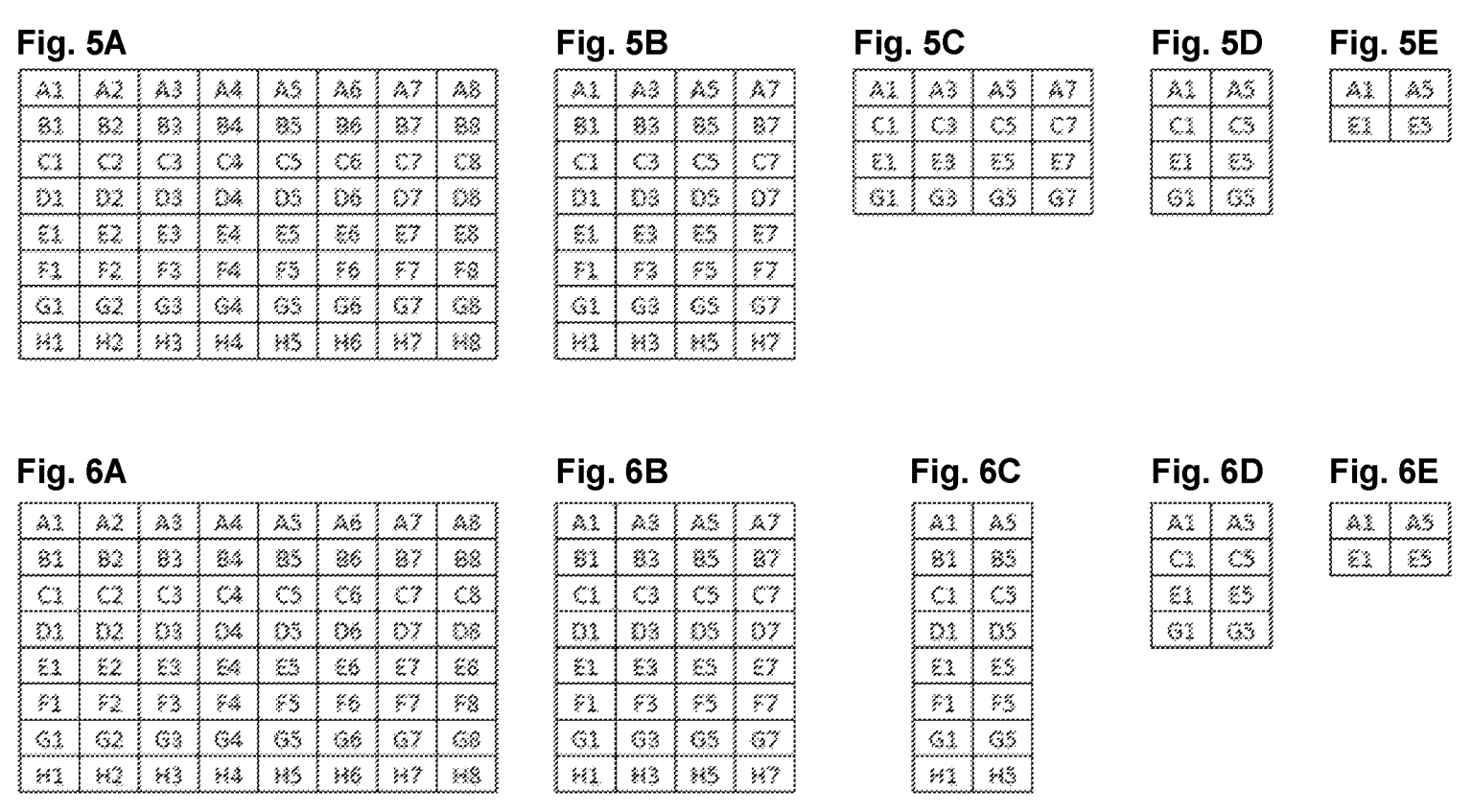

Each of FIGS. 5 and 6 represents the effect of applying two 2:1 downscalers, each in two dimensions, to the same input data (FIGS. 5A and 6A). That data is represented as a two-dimensional array of values (A1-H8). For ease of understanding the downscaling is performed by simple decimation by a factor of 2 (i.e. there is no additional filtering). FIGS. 5B-5E represent the outputs of a sequence of one-dimensional 2:1 downscalers operating for a first time in the first (horizontal) dimension (FIG. 5B), then for a first time in the second (vertical) direction (FIG. 5C), then for a second time in the first dimension (FIG. 5D) and then for a second time in the second dimension (FIG. 5E). In contrast, FIGS. 6B-6E represent the outputs of a sequence of one-dimensional 2:1 downscalers operating for a first time in the first (horizontal) dimension (FIG. 6B), then for a second time in the first dimension (FIG. 6C), then for a first time in the second (vertical) direction (FIG. 6D), then for a second time in the second dimension (FIG. 6E). In particular, it can be seen that although FIGS. 5C and 6C are not the same, the final outputs represented in FIGS. 5E and 6E are the same.

It will also be apparent from FIG. 6 that, by first performing all the downsampling in the first dimension, the first dimension is reduced to its minimum/target value before the downscalers operating in the second dimension are implemented. This provides a benefit in terms of implementation, because each line store need only be the width of the output from the series of downscalers operating on the first dimension. That is, as mentioned above, the line store width needs to be able to store a full line of (i.e. must have at least the same width as) the data provided to the downscaler, but in this case the line stores are not required until after all the downscaling in the first dimension has been completed. As a result, the data width is already at its minimum/target width before it needs to be stored in a line store for implementing a downscaler in the second dimension.

In practice, in the architecture of FIG. 4, this means that the width of each line store 406 associated with a downscaler operating in the second dimension (i.e. both for fixed factor and variable factor downscalers) can be of the same size, that being the minimum size that would be achieved in the final stage of the architecture of FIG. 1. As such, there is a practical benefit, in terms of reducing the amount of memory required, to implementing the architecture of FIG. 4 instead of FIG. 1. It is also simpler to extend the overall architecture, by adding more 2D fixed factor downscalers, as each 2D downscaler is implemented by the identical components as represented by dotted box 420 (whereas, in FIG. 1 for example, each separate 2D downscaler 102 would have a different memory requirement, in FIG. 4 each of the fixed factor downscalers in the first group 412 are identical to each other and each of the fixed factor downscalers in the second group 414 are identical to each other). That is, there are benefits to providing the output from the first group of downscalers, each operating in the same dimension, as an input to a second group of downscalers operating in a second dimension, instead of downscaling the two dimensions in register with each other.

Figure 11:
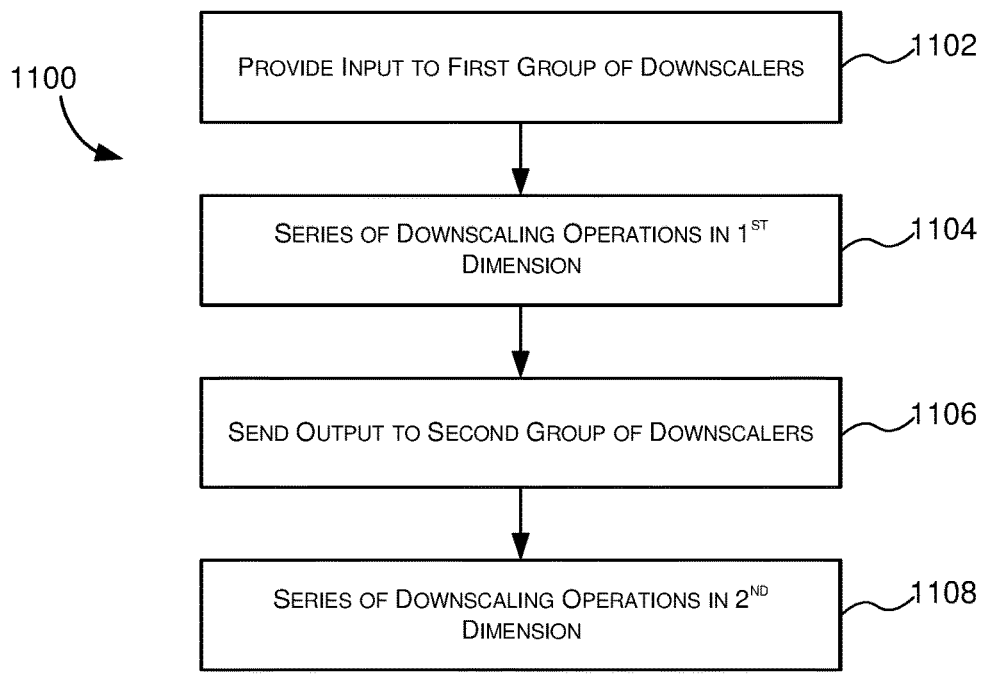
FIG. 11 is a flow diagram illustrating a method of downscaling.

FIG. 11 illustrates the method steps 1100 involved in implementing a downscaler according to FIG. 4. At step 1102 the array of data to be downscaled is provided as an input to the first group of downscalers 412 of the downscaling module 400. At step 1104, the first group of downscalers 412 performs a series of downscaling operations in a first dimension (i.e. the first downscaler in the group operates on the input to the group, and then each downscaler in the group 412 operates in series on the output of the previous downscaler in the group). The array of data may be received line-by-line by the downscalers, and the first dimension is preferably a dimension along the lines. As discussed, the downscalers in the first group 412 may be fixed or variable factor downscalers, or a mix thereof. Also as discussed, not every downscaler in the first group of downscalers 412 may contribute to the output of the group—that is, some of the downscalers may be bypassed, based on a control signal, depending on the required overall downscaling factor. The output from the final downscaler is sent to the second group of downscalers 414, at step 1106.

At step 1108, the second group of downscalers 414 performs a series of downscaling operations in a second dimension (i.e. the second downscaler in the group operates on the input to the group, and then each downscaler in the group 414 operates in series on the output of the previous downscaler in the group). Where the array of data is originally received line-by-line, the second dimension is preferably orthogonal to the first dimension described above. As discussed, the downscalers in the second group 414 may be fixed or variable factor downscalers, or a mix thereof. Preferably, to achieve the same downscaling in the first and second dimensions, the same number and type of downscaling operations are performed as in step 1102, but that need not be the case (e.g. even to achieve the same overall downscaling in both dimensions, a different number of operations implementing different scaling factors may be used in each dimension). The operation of the second group 414 of downscalers can involve the use of line stores 406 as already discussed in detail above (and in further detail below). The line stores may all be the same width. As for the first group, not every downscaler in the second group of downscalers 414 may contribute to the output of the group— that is, some of the downscalers may be bypassed, based on a control signal, depending on the required overall downscaling factor. The output from step 1108 is an array of data that has been downscaled in two dimensions compared to the original input array of data.

Turning in more detail to the filtering implemented by each downscaler, it has been mentioned that a common type of filter used for this purpose is a FIR filter. Such filters become expensive (in terms of hardware area and/or power draw) to implement as the number of coefficients or taps increases. They can also be computationally expensive to implement depending on the particular coefficients used by the filter. A particularly efficient implementation of a filter for performing 2:1 downsampling is discussed below. Such 2:1 downsampling (i.e. comprising two 3-tap FIR filters with a decimation to downsample in one dimension, as discussed below), can be used to implement the fixed function downscalers in FIGS. 1, 2 and 4.

A conventional FIR filter for 2:1 downsampling may have 5-taps. Based on a Gaussian distribution, the value of those five coefficients or weights would be 0.067, 0.242, 0.383, 0.242 and 0.067. However, those values are not particularly convenient for implementing a hardware filter (i.e. they do not lend themselves to convenient binary operations).

Instead, normalised Binomial coefficients (e.g. 1, 4 6, 4, 1, each normalised by dividing by 16) are a close approximation to the Gaussian coefficients. This is illustrated in the Table 1.

TABLE 1

Comparison of normalised Binomial coefficients and Gaussian coefficients

| Normalised Binomial Weights | Gaussian Weights |
|---|---|
| $1/16 = 0.0625$ | 0.067 |
| $4/16 = 0.25$ | 0.242 |
| $6/16 = 0.375$ | 0.383 |
| $4/16 = 0.25$ | 0.242 |
| $1/16 = 0.0625$ | 0.067 |

These normalised Binomial weights lend themselves more readily to binary mathematics, because 1 and 4 are powers of two (as well as the normalising 16) and 6 is a sum of two powers of two. Therefore, it would be significantly cheaper to implement a hardware 5-tap FIR using fixed Binomial coefficients (1 4 6 4 1), normalised by dividing by 16, compared to one using a standard set of Gaussian coefficients.

However, it has been identified that, starting from the Binomial coefficients, there is room for further optimisation. The inventors have identified that a 5-tap filter with normalised coefficients (1 4 6 4 1) can be de-convolved into a filter with normalised coefficients (1 2 1) followed by another filter with normalised coefficients (1 2 1). That is, implementing two three-tap filters with normalised coefficients (1 2 1) is equivalent to operating one 5-tap filter with normalised coefficients (1 4 6 4 1). Put another way, the overall filter can be deconvolved into two sub-filters. This de-convolution can be exploited in a 2:1 downsampler as discussed in more detail below. However, the equivalence of these two approaches is first discussed with reference to FIGS. 7 and 8.

FIGS. 7 and 8 illustrate how a 5-tap filter with normalised coefficients (1 4 6 4 1) produces the same output as two sequential 3-tap filters with normalised coefficients (1 2 1). It is noted that FIGS. 7 and 8 show all values (except for the input values in FIGS. 7A and 7B) rounded to 1 decimal place, as do the example calculations below. However, all calculations for deriving the values in FIGS. 7 and 8 were based on unrounded numbers (and hence some example calculations shown below might not appear to give exactly correct results).

FIG. 7 shows how a set of input data (FIG. 7A), presented as an array of values or samples (each initially taking an integer value from 1 to 10) is transformed by downscaling first on rows in the horizontal direction (the output of which is shown in FIG. 7B) and then by applying, to the output of that first downscaler, the same type of downscaling on columns in the horizontal direction (the output of which is shown in FIG. 7C). The downscaling operates by applying a decimation of factor 2 to the output of a 5-tap filter with normalised coefficients (1 4 6 4 1).

For example, the first value in the first row of FIG. 7B is based on a filter centred (horizontally) on the first value in the first row in FIG. 7A. As such, the filter also covers the second and third values in the first row of FIG. 7A, and also two values coming before the first value in the first row of FIG. 7A, which are taken to be zero in this example (although other implementations may handle this differently, for example by repeating the edge value or mirroring the values in the line). Thus the calculation, a normalised sum of the values weighted by the filter coefficients in order, is (filter values in bold for ease of understanding):

$$(1\times 0+4\times 0+6\times 1+4\times 2+1\times 3)/16=1.1$$

A similar calculation could be applied centred on the second value in the first row of FIG. 7A, as per the following calculation:

$$(1\times 0+4\times 1+6\times 2+4\times 3+1\times 4)/16=2$$

However, the result of that calculation does not appear in FIG. 7B, because it is removed by decimation. As a result, the second value in the first row of FIG. 7B is based on a filter centred on the third value in the first row of FIG. 7A, derived by the following calculation:

$$(1\times 1+4\times 2+6\times 3+4\times 4+1\times 5)/16=3$$

It will thus be apparent how the remaining values in FIG. 7B are derived—i.e. each value in FIG. 7B is based on a filtered value from odd columns in FIG. 7A.

Similarly, the first value in the first column of FIG. 7C is based on a filter centred (vertically) on the first value in the first column of FIG. 7B. As such, the filter also covers the second and third values in the first column of FIG. 7B, and also two values coming before the first value in the first column of FIG. 7B, which are taken to be zero. Thus the calculation, a normalised sum of the values weighted by the filter coefficients in order, is (bearing in mind that the actual values are used in the derivation of the values in the Figure, not the values rounded to 1 decimal place):

$$(1\times 0+4\times 0+6\times 1.1+4\times 1.4+1\times 2.1)/16=0.9$$

A similar calculation could be applied centred on the second value in the first column of FIG. 7B, as per the following calculation:

$$(1\times 0+4\times 1.1+6\times 1.4+4\times 2.1+1\times 2.8)/16=1.5$$

However, the result of that calculation does not appear in FIG. 7C, because it is removed by decimation. As a result, the second value in the first column of FIG. 7C is based on a filter centred on the third value in the first column of FIG. 7B, and is derived by the following calculation:

$$(1\times 1.1+4\times 1.4+6\times 2.1+4\times 2.8+1\times 3.4)/16=2.1$$

It will thus be apparent how the remaining values in FIG. 7C are derived—i.e. each value in FIG. 7C is based on a filtered value from odd rows in FIG. 7B.

In contrast to FIG. 7, FIG. 8 shows how a set of input data (shown in FIG. 8A as an array of values within a grid) is transformed by performing two filtering steps, instead of the one utilised in FIG. 8, for the two downsampling operations (i.e. in both the horizontal and vertical directions). FIG. 8B shows the output of a first filter with normalised coefficients (1 2 1) applied to the rows of the input shown in FIG. 8A. FIG. 8C shows the result of a second filter with normalised coefficients (1 2 1) applied to the rows of FIG. 8B, followed by decimation by a factor of 2. FIG. 8D shows the output of a first filter with normalised coefficients (1 2 1) applied to the columns of FIG. 8C. FIG. 8E shows the result of a second filter with normalised coefficients (1 2 1) applied to the columns of FIG. 8D, followed by decimation by a factor of 2. It will be observed that FIGS. 8B and 8C also include some italicised values outside the main grid of each figure, and these are explained in the following paragraphs, which detail how the various values are determined.

For example, the first value (within the grid) in the first row of FIG. 8B is based on a filter centred (horizontally) on the first value in the first row in FIG. 8A. As such, the filter also covers the second value in the first row of FIG. 8A, and also a value coming before the first value in the first row of FIG. 8A, which is taken to be zero. Thus the calculation, a normalised sum of the values weighted by the filter coefficients in order, is (filter values in bold for ease of understanding):

(1×0+2×1+1×2)/4=1.0

A similar calculation is applied centred on the second value in the first row of FIG. 8A, to derive the second value (within the grid) in the first row of FIG. 8B, as per the following calculation:

(1×1+2×2+1×3)/4=2.0

It is noted that the italicised value at the start of the first row of FIG. 8B is derived from a filter centred on a notional value (assumed to be zero) coming before the first value in the first row of FIG. 8A. As such, it is derived by the following calculation:

(1×0+2×0+1×1)/4=0.3

This value is calculated because there is (in later steps) a second filter applied in the same dimension, and this value becomes relevant to those calculations, as explained below. In practice, in the situation of FIG. 7 for example, such values may be calculated by the hardware anyway (as the stream of sample values is received) and simply discarded. For example when the first value '1' is received for the first row in FIG. 7A, a value for a 5-tap filter centred two samples 'before' the incoming '1' value could be calculated, but would not contribute to the required output data, and so would be discarded.

As mentioned above, no decimation is applied between FIGS. 8A and 8B. As such, it will be apparent how the remaining values in FIG. 8B are derived.

The second filtering operation on the rows is applied to the data shown in FIG. 8B to produce an output as shown in FIG. 8C The first value in the first row of FIG. 8C is based on a filter centred (horizontally) on the first value (within the grid) in the first row in FIG. 8B. As such, the filter also covers the second value (in the grid) in the first row of FIG. 8B, and also the italicised value coming before the first value (in the grid) in the first row of FIG. 8B. That is, in this case, although the filter covers a value that does not correspond to the position of one of the original data values, that value is not considered to be zero because it is possible to calculate the value, as explained above. As that value takes a contribution from the first value in the first row of the original data, this is the most accurate way of performing the calculations and ensures the same result as the 5-tap filter discussed with reference to FIG. 7. In some implementations such accuracy may not be required but, as already discussed, calculating the italicised values is relatively inexpensive. Returning to the example, the calculation for the first value in the first row of FIG. 8C, a normalised sum of the values weighted by the filter coefficients in order, is:

(1×0.3+2×1+1×2)/4=1.1

A similar calculation could be applied centred on the second value in the first row of FIG. 8B, as per the following calculation:

(1×1+2×2+1×3)/4=2.0

However, the result of that calculation does not appear in FIG. 8C, because it is removed by decimation. As a result, the second value in the first row of FIG. 8C is based on a filter centred on the third value (within the grid) in the first row of FIG. 8B, and is derived by the following calculation:

(1×2+2×3+1×4)/4=3.0

It will thus be apparent how the remaining values in FIG. 8C are derived. This completes the filtering in the row direction.

Similarly, considering filtering on the columns, the first filtering operation is applied to the values shown in FIG. 8C to produce an output as shown in FIG. 8D. The first value (within the grid) in the first column of FIG. 8D is based on a filter centred (vertically) on the first value in the first column in FIG. 8C. As such, the filter also covers the second value in the first column of FIG. 8C, and also a value coming before the first value in the first column of FIG. 8C, which is taken to be zero. Thus the calculation, a normalised sum of the values weighted by the filter coefficients in order, is (filter values in bold for ease of understanding):

(1×0+2×1.1+1×1.4)/4=0.9

A similar calculation is applied centred on the second value in the first column of FIG. 8C, to derive the second value (within the grid) in the first column of FIG. 8D, as per the following calculation:

(1×1.1+2×1.4+1×2.1)/4=1.5

It is noted that the italicised value above the first column of FIG. 8D is derived from a filter centred on a notional value (assumed to be zero) coming before the first value in the first column of FIG. 8C. As such, it is derived by the following calculation:

(1×0+2×0+1×1.1)/4=0.3(to 1 d.p.)

This value is relevant to later calculations, in the same way as the italicised values in FIG. 8B.

As mentioned above, no decimation is applied between FIGS. 8C and 8D. As such, it will be apparent how the remaining values in FIG. 8D are derived.

The second filtering operation on the columns is applied to the data shown in FIG. 8D to produce an output as shown in FIG. 8E The first value in the first column of FIG. 8E is based on a filter centred (vertically) on the first value (within the grid) in the first column in FIG. 8D. As such, the filter also covers the second value (in the grid) in the first column of FIG. 8D, and also the italicised value coming before the first value (in the grid) in the first column of FIG. 8D. That is, in this case, although the filter covers a value that does not correspond to the position of one of the original data values, that value is not considered to be zero because it is possible to calculate the value, as explained above. As that value takes a contribution from the first value in the first column of the original data, this is the most accurate way of performing the calculations and ensures the same result as the 5-tap filter discussed with reference to FIG. 7. In some implementations such accuracy may not be required but, as already discussed, calculating the italicised values is relatively inexpensive. Returning to the example, the calculation for the first value in the first column of FIG. 8E, a normalised sum of the values weighted by the filter coefficients in order, is:

(1×0.3+2×0.9+1×1.5)/4=0.9

A similar calculation could be applied centred on the second value in the first column of FIG. 8D, as per the following calculation:

(1×0.9+2×1.5+1×2.1)/4=1.5

However, the result of that calculation does not appear in FIG. 8E, because it is removed by decimation. As a result, the second value in the first column of FIG. 8E is based on a filter centred on the third value (within the grid) in the first column of FIG. 8D, derived by the following calculation:

$$(1\times1.5+2\times2.1+1\times2.8)/4=2.1$$

It will thus be apparent how the remaining values in FIG. 8E are derived.

A comparison of FIG. 7C and FIG. 8E shows that the final results of the two different filtering approaches—applying a single 5-tap (1 4 6 4 1) filter, and applying two sequential 3-tap (1 2 1) filters—produce the same output. In other words, the two approaches are functionally equivalent.

It might be assumed, given that the two approaches are functionally equivalent, that it would be more desirable to implement a single 5-tap filter with coefficients (1 4 6 4 1), rather than go to the trouble of creating two separate 3-tap filters with coefficients (1 2 1). However, the latter approach brings further benefits in terms of practical hardware implementation.

In particular a naïve 5-tap filter implementation (or a variable filter implementing a 5-tap operation) would computationally perform 5 multiplication operations (one for each coefficient) and 4 addition operations (to accumulate the 5 multiplication terms). However, by working with two 3-tap filters with coefficients (1 2 1), computational savings can be made in hardware because the coefficients are all powers of 2.

Firstly, it can be identified that each '1' coefficient (N.B. $1=2^0$) does not require a hardware multiplier—i.e. multiplying by 1 does not change the result, so input wires to a filter for the first and third filter terms can be routed directly to the summation step. Secondly, it can be identified that, for the second filter coefficient, a multiplication by 2 in binary corresponds to a bit shift—i.e. to multiply a binary number by two, all the bits can be shifted towards the most significant bit, with a trailing zero added. This is a very cheap operation to implement in hardware. In this context the skilled person will understand that a conventional hardware multiplier, or binary multiplier, is a circuit configured to multiply arbitrary numbers that can be conceptualised as performing binary long multiplication, which amounts to a sum of shifted values. In contrast, the present disclosure relates to arrangements in which multiplication by coefficient values is achieved using only bit shifts. That is, each filter performs its constituent multiplications using only bit shift operations. Of course, these observations do not account for the normalisation of the coefficients. However, in the case of the (1 2 1) coefficients, the normalisation involves a division by 4, which again is a power of 2 (i.e. $4=2^2$) and so simple to implement in binary as another bit shift (this time a shift of two places, and towards the least significant bit because it is a division). So, even accounting for the normalisation, by moving from a 5-tap filter to the two 3-tap filters, all the multiplications can be performed using only bit shifts.

Moreover, the combination of the two 3-tap filters and a decimation by a factor of 2 has been identified as lending itself to computationally efficient implementation.

Considering the downscaler operating in the dimension that lines of data are read, a practical implementation could be as follows in C-like pseudocode:

```
// First filter (apply 1 2 1 coefficients).
first_filter_x( value di ) // A new item of data di arrives every clock.
{
    // Initialise the last two buffered values to zero.
    static value di_2 = 0;
    static value di_1 = 0;
    // Evaluate and output the 1 2 1 convolution.
    output( di_2 + 2 * di_1 + di ) / 4;
    // Update the buffered values for the next invocation.
    di_2 = di_1;
    di_1 = di;
}
// Second filter (apply 1 2 1 coefficients with decimate).
second_filter_x( value gi, int x ) // A new item of data gi arrives from
            the first filter every clock.
{
    // Initialise interim to zero.
    static value interim = 0;
    if( is_odd( x ) )
    {
        // Odd column.
        output( (interim + gi) / 4 );
        interim = gi;
    }
    else
    {
        // Even column.
        interim += 2 * gi;
    {
}
```

In other words, in this example, the first filter is implemented as function first_filter_x. The function is invoked once for each of a stream of incoming data items (e.g. pixel/sample values), di. For a given data item di, the previous data item is stored as di_1, and the data item before that is stored as di_2. The values of di_1 and di_2 are initialised to zero through the static local variable initialisation calls (and those values may, for example, be stored in registers). The two previous data items are the only other values needed to perform each filter calculation (i.e. (di_2+2*di_1+di)/4) every time a new value arrives. As discussed above, that calculation itself is computationally cheap for the 3-tap filter.

For completeness, it is noted that the skilled person will appreciate that the filter value calculated when data item di arrives (i.e. (di_2+2*+di_1+di)/4) is the filter value centred on the position of data item di_1, and this offset can be simply accommodated in the hardware when producing the eventual output.

After the calculation is performed, and the resulting filter value has been output, the values stored as di_1 and di_2 are updated, in preparation for receiving the next incoming data item. The pseudo code shows that the value stored in di_2 (the current value of which will not be needed in the next calculation) is replaced with the value currently stored in di_1, and the value stored in di_1 is then replaced with the value of the current data item.

Moving on to the second filter, that is implemented in this example as function second_filter_x. The function is invoked once for each of a stream of data items, those data items, gi, being the output filter values of the first filter. The function also takes an argument x, which is used to track whether the data item gi corresponds to an 'odd' or 'even' column. This because the second filter only needs to output a value for every other column due to the decimation. In this example, the values are output for the incoming odd columns. Therefore, the full calculation of a filter value for the even columns can be omitted. Instead, a single value (which may be stored in a register), called interim (and initialised to zero) in the example, is manipulated every time a new value gi arrives from the first filter, to enable the calculation of the filter value for the columns that are kept. For a value gi corresponding to an odd column, the value of gi is added to the current value of interim, then that sum is divided by 4 and output to give the filter value. The value of interim is then set to the current value of gi. When the next incoming value arrives, it will be for an even column (i.e. one that will be removed by decimation), and interim is simply updated by adding two times the value of the new value that arrives. It will thus be clear that when the next new value arrives from the first filter (for the next odd column) and the new value gi is added to interim, the total value of interim will be: gi_2+2*gi_1+gi (where, for a given data item gi, the previous data item is gi_1, and the data item before that is gi_2), as required by the filter calculation.

It will thus be apparent that the factor of 2 decimation, in combination with the symmetrical coefficients of the 3-tap filter, allows for a simple cyclic calculation to be implemented. This filter, operating within the line of incoming data values, only requires a few hardware registers to implement, with 4 dual-input adders (and no adders used during multiplication, in contrast to a conventional multiplier for arbitrary numbers, by performing multiplications only by using binary bit shifts) to complete the equivalent of a decimation operation following on from a 5-tap filter with normalised (1 4 6 4 1) coefficients. It will be appreciated that although the example above refers to 'odd' and 'even' columns, this is an arbitrary choice. Also, as for the first filter, it will be appreciated that the filter values calculated will be offset compared to the original item that the filter value will be centred on, but this offset can be simply accommodated in the final output of the downsampler.

Considering now the downscaler operating in the dimension orthogonal to the lines of data that are read, similar advantages are realised, although the downscaler is necessarily more complicated due to the need to store lines of data. A practical implementation could be as set out below. In this example, the data is read as a sequence of lines extending in the x dimension, and the orthogonal direction is the y dimension (so a data item di is associated with coordinates (x,y) where the value x indicates the data value is in the xth column and with the value y indicates the data value is in the yth row):

```
// First filter (apply 1 2 1 coefficients).
first_filter_y( value di, int x, int y, value *linestore1,
        value *linestore2 ) // A new item of data di arrives every clock.
{
    if( is_odd( y ) )
    {
        // Odd line.
        // At the start of the line -
        //     linestore1 has data from 1 line ago.
        //     linestore2 has data from 2 lines ago. This is
        //     progressively replaced with data for the current line.
        output( (linestore2[x] + 2 * linestore1[x] + di) / 4 );
        linestore2[x] = di;
    }
    else
    {
        // Even line.
        // At the start of the line -
        //     linestore2 has data from 1 line ago.
        //     linestore1 has data from 2 lines ago. This is
        //     progressively replaced with data for the current line.
        output( (linestore1[x] + 2 * linestore2[x] + di) / 4 );
        linestore1[x] = di;
    }
}
// Second filter (apply 1 2 1 coefficients with decimate).
second_filter_y( value gi, int x, int y,
        value *linestore3 ) // A new item of data gi arrives from the
                            //   first filter every clock.
{
    if( is_odd( y ) )
    {
        // Odd line.
        // If gi is the data value g at position x,y. i.e. g(x,y),
        // then linestore3[x] contains g(x,y-2) + 2 * g(x,y-1).
        output( (linestore3[x] + gi) / 4 );
        linestore3[x] = gi;
    }
    else
    {
        // Even line.
        // If gi is the data value g at position x,y. i.e. g(x,y),
        // then linestore3[x] contains g(x,y-1).
        linestore3[x] += (2 * gi);
    }
}
```

In other words, in this example, the first orthogonal filter is implemented as a function first_filter_y. The function is invoked once for each of a stream of incoming data items (e.g. pixel/sample values), di. The function also receives arguments x and y and manipulates two line stores linestore1 and linestore2. The operation of the first filter is broadly the same for both odd and even rows, but with alternating use of the line stores. So, for values in an odd row, the value from the same x position as the current data value di in the previous row (i.e. the data value at position (x, y−1)) is read from linestore1[x]. Similarly, for values in an odd row, the value from the same x position as the current data value di in the row before the previous row (i.e. the data value at position (x, y−2)) is read from linestore2[x]. The filter value can therefore be calculated for the current value di as: linestore2[x]+2*linestore1[x]+di)/4. The current value di is then written to linestore2[x]. As such, linestore2 is updated so that, by the middle of the line, it will half contain values from two lines ago and half contain earlier values from the present line. By contrast, for values in an even row, then it is linestore1[x] that has values from two lines ago, and linestore2[x] that has values from one line ago. As such, the same calculations/operations are performed as for the values in the odd rows, but using the line stores the other way around, i.e. so the filter value is calculated from: linestore1[x]+2*linestore2[x]+di)/4. Then, the current value is stored to linestore1[x] after the filtered value has been output.

Moving on to the second orthogonal filter, that is implemented in this example as function second_filter_y. The function is invoked once for each of a stream of data items, those data items, gi, being the output filter values of the first orthogonal filter. The function also receives arguments x and y (and thus the data value can also be referred to as g (x,y)) and manipulates a single line store linestore3. The second orthogonal filter can be implemented with a single line store, rather than two line stores (as used by the first orthogonal filter), because it only needs to output a value for every other row due to the decimation. In this example, the values are output for the incoming odd rows. For a value g (x,y) corresponding to an odd row, the value from linestore3[x] is read out. As will be apparent from the discussion below, linestore3[x] will contain a value equal to the sum of the value from the equivalent x position two rows ago (i.e. g (x, y−2)) with twice the value from the equivalent x position one row ago (i.e. g (x, y−1)). The value g (x,y) is added to the current value of linestore3[x], then that sum is divided by 4 and output to give the filter value. Then linestore3[x] is set to the current value g(x,y). When the next incoming value arrives, it will be for an even row (i.e. one that will be removed by decimation), so no filter value is output. Instead, the value of the equivalent x position from the previous row is currently in linestore3[x], and linestore3[x] is incremented by twice the current value g (x,y). It will thus be clear that, as mentioned above, when the next new value arrives from the first filter (for the next odd row) and the new value g (x,y) is added to the value in linestore3[x], the total value will be: g (x, y−2)+2*g (x, y−1)+g (x,y), the value of the summation required by the filter calculation for the odd lines.

From the paragraphs above, it will be apparent that only three line stores are required to implement the combination of a two-dimensional filter and two-dimensional decimation. Further, as already mentioned, those line stores can all be of the minimum size possible—i.e. the downsampled width of the lines. This contrasts favourably with a conventional 5-tap filter which would need 4 line stores, and which would be conventionally sized to the width of the input data. Furthermore the 5 full multipliers of a conventional 5-tap filter can be replaced by exploiting the fact that all multiplications or divisions involve a multiplication by a power of 2, which means that they can be simply implemented as bit shifts (for completeness, it is noted that a shift of zero bits, i.e. no shift, occurs where the multiplication involves multiplying by 1 ($2^0$)), without increasing the number of additions required.

Figure 12:
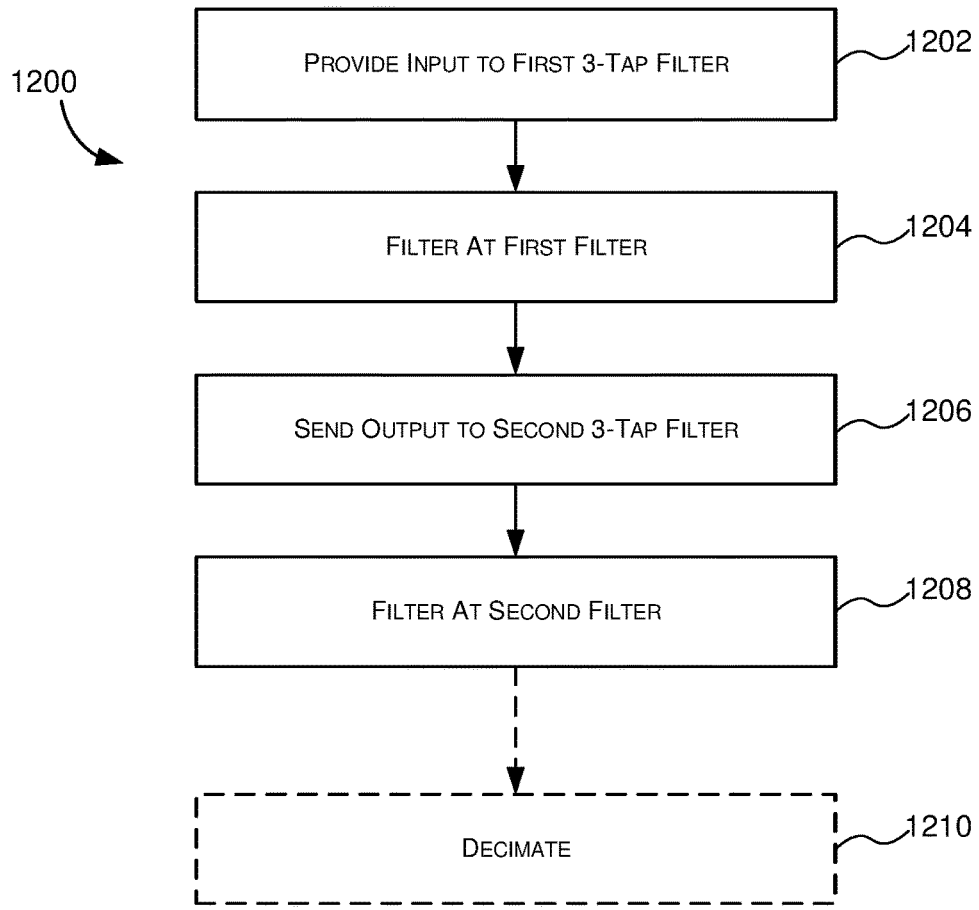
FIG. 12 is a flow diagram illustrating a method of filtering and optionally downscaling.

Although FIR filters find many uses, the foregoing discussion of an efficient filter implementation has been in the context of a hardware downscaler, and FIG. 12 illustrates a method 1200 for filtering using a hardware architecture exploiting that implementation and for optionally performing downscaling too. At step 1202 a received input (e.g. an array of data, but in the more general sense of an FIR filter the data may simply be a one-dimensional series of data values), is input to hardware logic implementing a first three-tap filter (which may be considered to be a first sub-filter of an overall filter). As has been discussed, such logic may be implemented only using binary bit shifts, because the filter coefficients are all integer powers of 2 (specifically, negative integer powers of 2). In particular, the filter coefficients may be (¼ ½ ¼.), or written another way ($2^{-2}$ $2^{-1}$ $2^{-2}$). At step 1204 the first filtering operation is performed at the first filter, and the at step 1206 the output of that operation is provided as an input to hardware logic implementing a second three-tap filter (which may be considered to be a second sub-filter of an overall filter). The output of the second filter may then be subjected to decimation in step 1210, in the case of a downscaling operation. For example, if it were desired to downsample the original input by a factor of 2, a decimation with a factor of 2 would be applied to the output of the hardware logic implementing the second filter. Although step 1210 is shown separately to step 1208 in FIG. 12, in some arrangements the hardware logic implementing the decimator and the hardware logic implementing the last filter (i.e. the second filter in the present discussion) may be integrated. In either case, the hardware logic for implementing the decimator and the hardware logic implementing the last (i.e. the second in the present discussion) filter are configured to cooperate to produce an output downscaled by desired amount (i.e. a half in the present discussion) in comparison to an input to the first FIR filter.

Moreover, it will be apparent from the foregoing that the benefit of deconvolving the 5-tap filter with binomial coefficients to two 3-tap filters can also be exploited for higher-order filters too. In fact, as would be expected from binomial theorem, any FIR filter with a total number of $2^N+1$ taps and binomial coefficients (where N is an integer and N>1) can be decomposed into a series of N three-tap FIR sub-filters. Therefore, although the preceding discussion has focused on an example with N=2 (i.e. a 5-tap filter; N=2, $2^N+1=5$) deconvolved into two three-tap filters, the skilled person would readily understand how it can also be applied to providing hardware architectures for FIR filters with higher values of N (e.g. 9-tap filter, etc.). That is, for every n, where n is an integer from to 1 to N−1, the architecture would be configured to provide the output from the nth one of the sub-filters as an input to the (n+1)th sub-filter. In any case, for all values of N, implementing three-tap sub-filters with normalised coefficients of (1 2 1)—i.e. coefficients of (¼ ½ ¼)—allows for the removal of any adders from multipliers in the filter architecture (although, for clarity, it will be appreciated that the filter will still incorporate other adders, outside the filter weight multiplication operations, to perform the sum of the multiplication terms).

As such, it will also be understood that the dashed arrow between steps 1208 and 1210 not only symbolises the optional nature of the step 1210, but also the fact that that a sequence of steps equivalent to steps 1206 and 1208 may be repeated a number of times that depends on the value of N.

For clarity, the foregoing discussion has treated the image data as represented by a single value at each pixel or sample location, with the result that one downscaling operation is required in a given dimension for a particular sample location. This could represent monochrome image data but, in practice, data often has multiple channels—e.g. RGB image data has a red value, green value and blue value for each sample location. For such multi-channel data, each channel can be downsampled separately and then recombined to provide an output. Therefore, the architectures discussed above can be adapted to account for multiple channels by either processing each channel through the architecture separately (i.e. in series), or by providing a separate hardware filter/downscaler for each channel, so that all channels can be processed in parallel. Of course, a combination of these two approaches (multiple hardware filters/downscalers, not enough to process all channels at once, but allowing batches of channels to be run together) could also be implemented. As will be readily understood, the most desirable option will depend on a trade-off between the hardware area cost and throughput, which will depend on the particular application.

In other scenarios, image data in a format that utilises chroma subsampling (e.g. YUV420) may be processed through the architecture. If it is desired to combine the downsampling with a conversion to a different colour space, it may be desirable to downsample different channels by different amounts. For example, if the input data is in YUV420 format, that means that the chrominance U and V channels are only sampled at half the rate of the luminance Y channel. If it is desired to downsample by a factor of 28, but also to ultimately output in an RGB444 format, the downscaler operating on the Y channel could be set to downscale by a factor of 28, whilst the U and V channels downscale by a factor of 14 (i.e. because they were already sampled at half the rate of the Y channel), to provide the output in a 444 format to be provided to a final colour space converter. In other words, where multichannel image data is received, it is not necessarily the case that each channel will need to be downsampled by the same amount.

Figure 9:
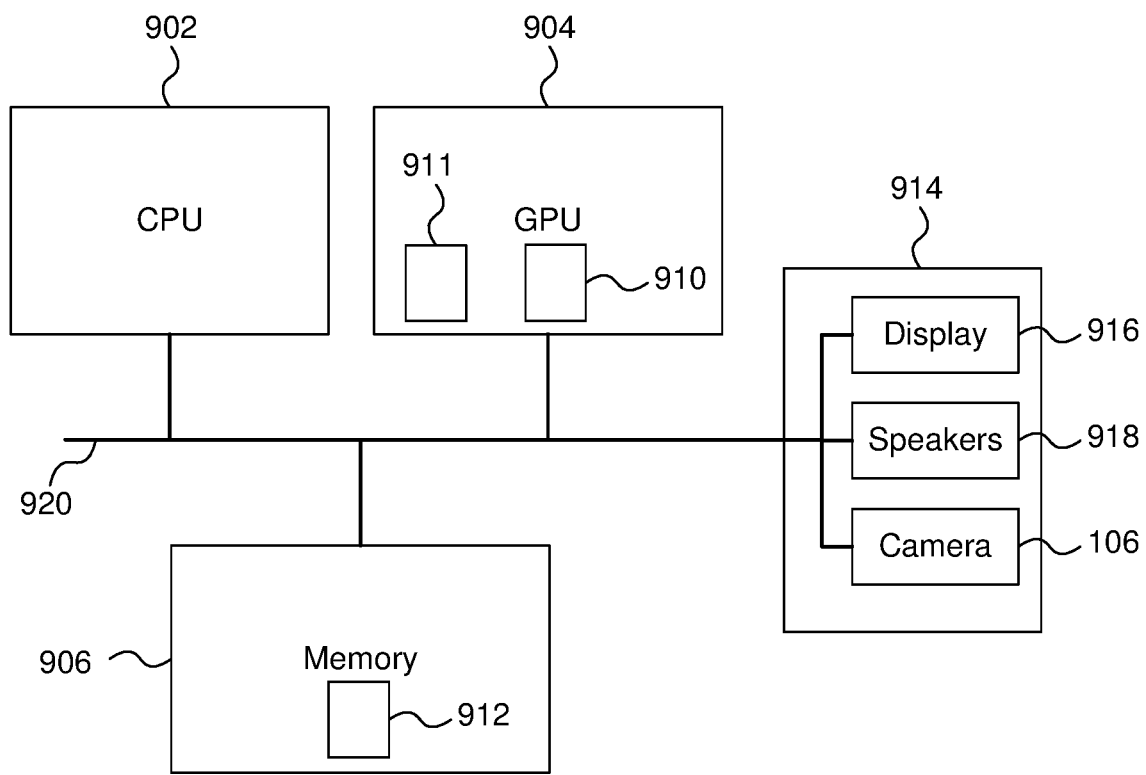
FIG. 9 shows a computer system in which a graphics processing system is implemented.

FIG. 9 shows a computer system in which the downscalers or filters described herein may be implemented. The computer system comprises a CPU 902, a GPU 904, a memory 906 and other devices 914, such as a display 916, speakers 918 and a camera 106. A processing block 910 (which may comprise any of the discussed downscalers or filters) is implemented on the GPU 904. In other examples, the processing block 910 may be implemented on the CPU 902. The components of the computer system can communicate with each other via a communications bus 920. A store 912 (corresponding to store 112) is implemented as part of the memory 906.

In the illustrated embodiment, the GPU 904 comprises a neural network accelerator 911 alongside the processing block 910, which may be configured to receive image data as an input. However, whilst FIG. 9 illustrates one implementation of a graphics processing system, it will be understood that a similar block diagram could be drawn for an artificial intelligence accelerator system—for example, by replacing either the CPU 902 or the GPU 904 with the Neural Network Accelerator (NNA) 911, or by adding the NNA as an additional/separate unit. In such cases, the processing block 910 can be implemented in the NNA.

The Figures are shown as comprising a number of functional blocks. This is schematic only and is not intended to define a strict division between different logic elements of such entities. Each functional block may be provided in any suitable manner. It is to be understood that intermediate values described herein as being formed by a downscaling module, downscaler or filter need not be physically generated by the downscaling module, downscaler or filter at any point and may merely represent logical values which conveniently describe the processing performed by the downscaling module, downscaler or filter between its input and output.

The downscalers and filters described herein may be embodied in hardware on an integrated circuit. The downscalers and filters described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be or comprise any kind of general purpose or dedicated processor, such as a CPU, GPU, NNA, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a downscaling module, downscaler or filter configured to perform any of the methods described herein, or to manufacture a downscaling module, downscaler or filter comprising any apparatus described herein. An integrated circuit definition dataset may be, for example, an integrated circuit description.

Therefore, there may be provided a method of manufacturing, at an integrated circuit manufacturing system, a downscaling module, downscaler or filter as described herein. Furthermore, there may be provided an integrated circuit definition dataset that, when processed in an integrated circuit manufacturing system, causes the method of manufacturing a downscaling module, downscaler or filter to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS (RTM) and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a downscaling module, downscaler or filter will now be described with respect to FIG. 10.

Figure 10:
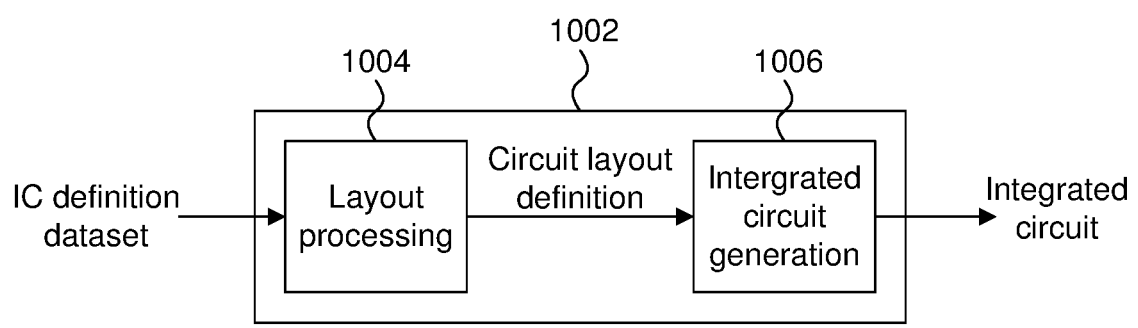
FIG. 10 shows an integrated circuit manufacturing system for generating an integrated circuit embodying a graphics processing system.

FIG. 10 shows an example of an integrated circuit (IC) manufacturing system 1002 which is configured to manufacture a downscaling module, downscaler or filter as described in any of the examples herein. In particular, the IC manufacturing system 1002 comprises a layout processing system 1004 and an integrated circuit generation system 1006. The IC manufacturing system 1002 is configured to receive an IC definition dataset (e.g. defining a downscaling module, downscaler or filter as described in any of the examples herein), process the IC definition dataset, and generate an IC according to the IC definition dataset (e.g. which embodies a downscaling module, downscaler or filter as described in any of the examples herein). The processing of the IC definition dataset configures the IC manufacturing system 1002 to manufacture an integrated circuit embodying a downscaling module, downscaler or filter as described in any of the examples herein.

The layout processing system 1004 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1004 has determined the circuit layout it may output a circuit layout definition to the IC generation system 1006. A circuit layout definition may be, for example, a circuit layout description.

The IC generation system 1006 generates an IC according to the circuit layout definition, as is known in the art. For example, the IC generation system 1006 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1006 may be in the form of computer-readable code which the IC generation system 1006 can use to form a suitable mask for use in generating an IC.

The different processes performed by the IC manufacturing system 1002 may be implemented all in one location, e.g. by one party. Alternatively, the IC manufacturing system 1002 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a downscaling module, downscaler or filter without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 10 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 10, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A hardware downscaling module for downscaling an array of values having at least two dimensions, the hardware downscaling unit comprising:
    a first group of one-dimensional downscalers;
    a second group of one-dimensional downscalers; and
    hardware logic configured to bypass one or more of the one-dimensional downscalers in the first group, and one or more of the one-dimensional downscalers in the second group, in response to a control signal;
    wherein the first group of one-dimensional downscalers is arranged to receive the array of values and to perform downscaling in series in a first dimension; and wherein the second group of one-dimensional downscalers is arranged to receive an output from the first group of one-dimensional downscalers and to perform downscaling in series in a second dimension.

2. The hardware downscaling module of claim 1, wherein the first and second groups each comprise a plurality of fixed factor downscalers.

3. The hardware downscaling module of claim 2, wherein each fixed factor downscaler downscales by the same fixed factor.

4. The hardware downscaling module of claim 3, wherein each fixed factor downscaler is a 2:1 downscaler.

5. The hardware downscaling module of claim 4 wherein each 2:1 downscaler comprises two 3-tap FIR filters.

6. The hardware downscaling module of claim 2, wherein the first and second groups each further comprise a single variable factor downscaler.

7. The hardware downscaling module of claim 1, wherein the hardware downscaling module is configured to receive the array of values line-by-line, and wherein the first dimension is a dimension along the lines, and the second dimension is orthogonal to the first dimension.

8. The hardware downscaling module of claim 7, wherein each of second group of downscalers further comprises one or more line stores.

9. The hardware downscaling module of claim 8, wherein the line widths of the line stores are the same for all of the second group of downscalers, and optionally wherein the line widths are a line width of the output from the first group of one-dimensional downscalers.

10. A computer-implemented method for downscaling an array of values having at least two dimensions using a hardware downscaling module, the method comprising:
   providing the array of values as an input to a first group of one-dimensional downscalers;
   performing, at the first group of one-dimensional downscalers, a series of downscaling operations in a first dimension;
   providing an output from the first group of one-dimensional downscalers to a second group of one-dimensional downscalers; and
   performing, at the second group of one-dimensional downscalers, a series of downscaling operations in a second dimension;
   wherein the method comprises bypassing, in response to a control signal, one or more of the one-dimensional downscalers in the first group and one or more of the one-dimensional downscalers in the second group.

11. The computer-implemented method of claim 10, wherein the first and second groups each comprise a plurality of fixed factor downscalers.

12. The computer-implemented method of claim 11, wherein the first and second groups each further comprise a single variable factor downscaler.

13. The computer-implemented method of claim 10, further comprising receiving the array of values line-by-line, and wherein the first dimension is a dimension along the lines, and the second dimension is orthogonal to the first dimension.

14. The computer-implemented method of claim 13, wherein performing, at the second group of one-dimensional downscalers, a series of downscaling operations in the second dimension, further comprises accessing a line store of the same width for each downscaling operation.

15. The hardware downscaling module of claim 1, wherein the hardware downscaling module is embodied on an integrated circuit.

16. A non-transitory computer readable storage medium having stored thereon a computer readable dataset description of a hardware downscaling module as claimed in claim 1, that, when processed in an integrated circuit manufacturing system, causes the integrated circuit manufacturing system to manufacture an integrated circuit embodying the hardware downscaling module.

17. An integrated circuit manufacturing system configured to manufacture a hardware downscaling module as claimed in claim 1.

18. An integrated circuit manufacturing system comprising:
   a non-transitory computer readable storage medium having stored thereon a computer readable description of a hardware downscaling module as claimed in claim 1;
   a layout processing system configured to process the computer readable description so as to generate a circuit layout description of an integrated circuit embodying a hardware downscaling module; and
   an integrated circuit generation system configured to manufacture a hardware downscaling module according to the circuit layout description.

* * * * *